(12) United States Patent
Kim et al.

(10) Patent No.: US 11,994,921 B2
(45) Date of Patent: May 28, 2024

(54) DISPLAY APPARATUS

(71) Applicant: SAMSUNG ELECTRONICS CO., LTD., Suwon-si (KR)

(72) Inventors: Sung Ki Kim, Suwon-si (KR); Hyun Jun Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 192 days.

(21) Appl. No.: 17/542,604

(22) Filed: Dec. 6, 2021

(65) Prior Publication Data
US 2022/0093891 A1    Mar. 24, 2022

Related U.S. Application Data

(63) Continuation of application No. PCT/KR2019/015115, filed on Nov. 8, 2019.

(30) Foreign Application Priority Data

Jun. 4, 2019 (KR) .......................... 10-2019-0065812

(51) Int. Cl.
*G06F 1/20* (2006.01)
(52) U.S. Cl.
CPC .................... *G06F 1/203* (2013.01)
(58) Field of Classification Search
CPC ....................................... G06F 1/203
See application file for complete search history.

(56) References Cited

U.S. PATENT DOCUMENTS

| | | | | |
|---|---|---|---|---|
| 5,268,816 A | * | 12/1993 | Abell, Jr. | G06F 1/1671 |
| | | | | 361/679.55 |
| 5,450,221 A | * | 9/1995 | Owen | B60Q 3/14 |
| | | | | 362/23.18 |
| 5,666,261 A | * | 9/1997 | Aguilera | B32B 7/12 |
| | | | | 428/116 |
| 5,811,923 A | * | 9/1998 | Zieba | G02B 5/208 |
| | | | | 348/835 |

(Continued)

FOREIGN PATENT DOCUMENTS

| JP | 2005-337612 A | 12/2005 |
|---|---|---|
| KR | 10-0446084 B1 | 8/2004 |
| KR | 10-0647591 B1 | 11/2006 |

OTHER PUBLICATIONS

International Search for International Patent Application No. PCT/KR2019/015115 dated Mar. 9, 2020.

(Continued)

*Primary Examiner* — Adrian S Wilson
(74) *Attorney, Agent, or Firm* — STAAS & HALSEY LLP

(57) ABSTRACT

A display apparatus comprises a display panel, a support panel arranged at a rear of the display panel, and a control module arranged at a rear of the support panel to control the display panel. The support panel comprises a first body arranged at the rear of the display panel, a second body bonded to the first body at a rear of the first body to form an accommodation space with the first body, and a heat absorbing material accommodated in the accommodation space to receive heat from the display panel that is absorbed by the first body, to thereby reduce an increase in a temperature of the display panel.

11 Claims, 11 Drawing Sheets

(56) References Cited

U.S. PATENT DOCUMENTS

| | | | | |
|---|---|---|---|---|
| 5,831,374 | A * | 11/1998 | Morita | H05K 7/20963 313/493 |
| 5,952,782 | A * | 9/1999 | Nanto | H01J 11/12 313/586 |
| 6,346,334 | B1 * | 2/2002 | Kamitani | B32B 7/12 428/521 |
| 6,700,315 | B2 * | 3/2004 | Kim | H05K 7/20963 362/348 |
| 6,849,992 | B2 * | 2/2005 | Kim | H05K 7/20963 313/46 |
| 6,882,108 | B2 * | 4/2005 | Kim | H05K 7/20963 313/46 |
| 7,161,296 | B2 * | 1/2007 | Kim | H05K 7/20 361/679.01 |
| 7,176,605 | B2 * | 2/2007 | Bae | H05K 7/20963 313/46 |
| 7,224,121 | B2 * | 5/2007 | Ahn | H05K 7/20009 313/582 |
| 7,235,922 | B2 * | 6/2007 | Jun | H05K 7/20963 313/582 |
| 7,323,808 | B2 * | 1/2008 | Kim | H05K 7/20963 313/582 |
| 7,554,798 | B2 * | 6/2009 | Tanokuchi | H05K 5/02 361/679.21 |
| 7,649,737 | B2 * | 1/2010 | Matsuzawa | H05K 7/20963 361/688 |
| 7,679,285 | B2 * | 3/2010 | Kim | H05K 7/20963 313/45 |
| 7,679,931 | B2 * | 3/2010 | Kim | H05K 7/20963 361/753 |
| 7,876,553 | B2 * | 1/2011 | Okimoto | H05K 7/20963 361/679.21 |
| 8,093,811 | B2 * | 1/2012 | Tanokuchi | H05K 5/02 313/582 |
| 8,107,259 | B2 * | 1/2012 | Hirota | H04M 1/0214 361/755 |
| 8,125,771 | B2 * | 2/2012 | Yukawa | G06F 1/16 313/582 |
| 8,922,983 | B1 * | 12/2014 | Owen | G06F 1/1656 361/679.21 |
| 9,459,660 | B2 * | 10/2016 | Yajima | G06F 1/1637 |
| 9,709,295 | B2 * | 7/2017 | Adamik | H05K 1/0254 |
| 9,769,964 | B2 * | 9/2017 | Byun | H01L 23/3735 |
| 9,784,467 | B2 * | 10/2017 | Adamik | H05K 5/0018 |
| 10,114,422 | B2 * | 10/2018 | Lee | H05K 9/0054 |
| 10,234,161 | B2 * | 3/2019 | Adamik | F24F 11/30 |
| 10,480,805 | B2 * | 11/2019 | Mulhouse | H05K 5/0018 |
| 11,775,020 | B2 * | 10/2023 | Yug | B23K 26/0622 361/679.01 |
| 2003/0017320 | A1 * | 1/2003 | Ebihara | B32B 15/08 428/317.1 |
| 2003/0025428 | A1 * | 2/2003 | Kim | H05K 7/20963 313/46 |
| 2003/0230381 | A1 * | 12/2003 | Watanabe | H01J 9/52 156/717 |
| 2005/0047067 | A1 * | 3/2005 | Bang | H05K 7/20963 361/679.5 |
| 2005/0057915 | A1 * | 3/2005 | Tsai | G02B 6/006 362/600 |
| 2005/0073253 | A1 * | 4/2005 | Lin | H05K 7/20963 445/24 |
| 2005/0077835 | A1 * | 4/2005 | Kim | H05K 7/20963 315/169.4 |
| 2005/0212429 | A1 * | 9/2005 | Aoki | H01J 9/02 313/586 |
| 2005/0243106 | A1 * | 11/2005 | Bae | H05K 7/20963 361/728 |
| 2005/0258749 | A1 * | 11/2005 | Ahn | H05K 7/20009 313/582 |
| 2006/0028790 | A1 * | 2/2006 | Baek | G02F 1/133308 361/679.21 |
| 2007/0153458 | A1 * | 7/2007 | Okimoto | H05K 7/20972 361/679.22 |
| 2011/0134064 | A1 * | 6/2011 | Goertz | G06F 3/0421 345/173 |
| 2012/0229726 | A1 * | 9/2012 | Kim | G02F 1/1336 349/58 |
| 2012/0231566 | A1 * | 9/2012 | Oh | G02F 1/1333 438/27 |
| 2013/0147079 | A1 * | 6/2013 | Ji | G06F 1/1656 264/105 |
| 2013/0328462 | A1 * | 12/2013 | Pakula | G06F 1/1658 312/223.1 |
| 2014/0008041 | A1 | 1/2014 | In et al. | |
| 2017/0090109 | A1 | 3/2017 | Sasaki | |
| 2019/0165300 | A1 | 5/2019 | Lee | |
| 2021/0307213 | A1 * | 9/2021 | Kim | G02F 1/133628 |

OTHER PUBLICATIONS

Office Action dated Feb. 26, 2024, in Korean Application No. 10-2019-0065812.

* cited by examiner

DISPLAY APPARATUS

CROSS-REFERENCE TO RELATED APPLICATIONS

This application is a continuation application, under 35 U.S.C. § 111(a), of International Patent Application No. PCT/KR2019/015115, filed on Nov. 8, 2019, which is based on and claims the priority benefit to Korean Patent Application No. 10-2019-0065812, filed on Jun. 4, 2019 in the Korean Patent and Trademark Office, the disclosures of which are hereby incorporated by reference in their entirety.

BACKGROUND

Field

The present disclosure relates to a display apparatus having a thin thickness while ensuring heat dissipation and rigidity characteristics.

Description of the Related Art In general, a display apparatus is a device that displays a screen, and includes a monitor, a television, and the like.

The display apparatus includes various types of display apparatuses, such as a display apparatus using a cathode ray tube, a display apparatus using a light emitting diode, a display apparatus using an organic light emitting diode, a liquid crystal display apparatus and an electronic paper display apparatus.

In comparison with the liquid crystal display apparatus, the display apparatus using the organic light emitting diode has superior luminance characteristics and viewing angle characteristics, and it is possible to implement the display apparatus using the organic light emitting diode in an ultra-thin shape because of not requiring a backlight unit.

As for the display apparatus using the organic light emitting diode, a thickness of a support panel is inevitably increased to satisfy both heat dissipation and rigidity standards.

However, because the display apparatus using the organic light emitting diode is implemented as an ultra-thin, when thickness of the support panel is increased, it is difficult to secure an internal space to which various mechanical engineering techniques are applied.

SUMMARY

One aspect of the present disclosure provides a display apparatus including a display panel, a support panel arranged at a rear of the display panel, and a control module arranged at a rear of the support panel to control the display panel. The support panel includes a first body arranged at the rear of the display panel, a second body bonded to the first body at a rear of the first body to form an accommodation space with the first body, and a heat absorbing material accommodated in the accommodation space to receive heat from the display panel that is absorbed by the first body, to thereby reduce an increase in a temperature of the display panel.

Each of the first body and the second body may include a plurality of beading formed to protrude along a direction facing each other.

The plurality of beading may include a plurality of first beading formed to protrude from the first body toward the second body, and a plurality of second beading formed to protrude from the second body toward the first body.

Each of the plurality of first beading may include a first protruding portion formed to protrude toward the second body, and a first concave portion formed on an opposite surface of the first protruding portion.

Each of the plurality of second beading may include a second protruding portion formed to protrude toward the first body, and a second concave portion formed on an opposite surface of the second protruding portion.

The first protruding portion may be among a plurality of first protruding portions and the second protruding portion may be among a plurality of second protruding portions.

The support panel may include a three-layer structure, and a double junction structure where the plurality of first protruding portions are bonded to the second body and the plurality of second protruding portions are bonded to the first body.

A contact area between the first body and the heat absorbing material may be increased by the plurality of first beading, and a contact area between the second body and the heat absorbing material may be increased by the plurality of second beading.

Heat generated by the display panel may be absorbed by the first body and the heat absorbed by the first body may be efficiently transferred to the heat absorbing material through a contact surface that is increased between the first body and the heat absorbing material.

Heat transferred to the heat absorbing material may be efficiently transferred to the second body through a contact surface that is increased between the second body and the heat absorbing material, and then discharged to an outside.

The plurality of first beading and the plurality of second beading may be formed to have a high density, respectively, at a position corresponding to a center and an upper end of the display panel in which a temperature of the display panel is relatively high.

The plurality of first protruding portions and the plurality of second protruding portions may be bonded to the second body and the first body, respectively, by an adhesive.

The plurality of first protruding portions and the plurality of second protruding portions may be bonded to the second body and the first body, respectively, by mechanical bonding by press-fitting or brazing.

A hole may be formed in the second body corresponding to a bonding surface between the plurality of first protruding portions and the second body, and a hole is formed in the first body corresponding to a bonding surface between the plurality of second protruding portions and the first body.

The first body may include a plurality of protrusions formed to protrude along a direction facing the second body and bonded to the second body, and the second body may include a plurality of beading formed to protrude along a direction facing the first body and bonded to the first body.

The heat absorbing material may be filled in the plurality of protrusions, and each of the plurality of beading may include a protruding portion formed to protrude toward the first body and a concave portion formed on an opposite surface of the protruding portion.

BRIEF DESCRIPTION OF THE DRAWINGS

These and/or other aspects of the disclosure will become apparent and more readily appreciated from the following description of the embodiments, taken in conjunction with the accompanying drawings of which.

DETAILED DESCRIPTION

Figure 1:
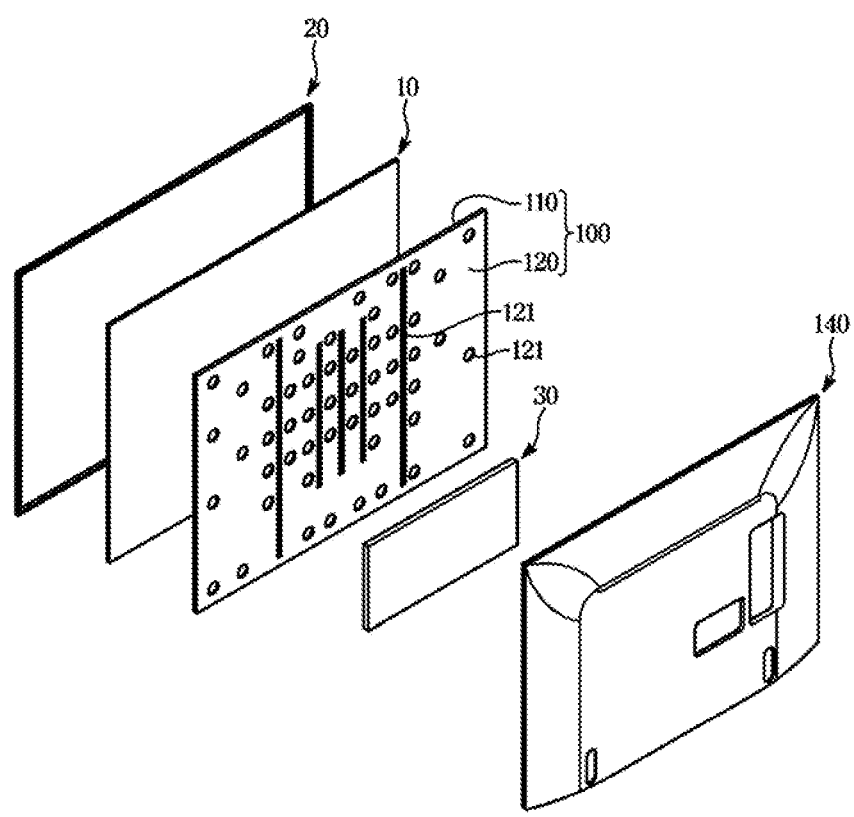
FIG. 1 is a schematic exploded perspective view of a display apparatus according to one embodiment of the present disclosure.

Embodiments described in the disclosure and configurations shown in the drawings are merely examples of the embodiments of the disclosure, and may be modified in various different ways at the time of filing of the present application to replace the embodiments and drawings of the disclosure.

In addition, the same reference numerals or signs shown in the drawings of the disclosure indicate elements or components performing substantially the same function.

Also, the terms used herein are used to describe the embodiments and are not intended to limit and/or restrict the disclosure. The singular forms "a," "an" and "the" are intended to include the plural forms as well, unless the context clearly indicates otherwise. In this disclosure, the terms "including", "having", and the like are used to specify features, numbers, steps, operations, elements, components, or combinations thereof, but do not preclude the presence or addition of one or more of the features, elements, steps, operations, elements, components, or combinations thereof.

It will be understood that, although the terms first, second, third, etc., may be used herein to describe various elements, but elements are not limited by these terms. These terms are only used to distinguish one element from another element. For example, without departing from the scope of the disclosure, a first element may be termed as a second element, and a second element may be termed as a first element. The term of "and/or" includes a plurality of combinations of relevant items or any one item among a plurality of relevant items.

In the following detailed description, the terms of "front surface", "rear surface", "front side", "rear side", "upper portion", "lower portion", "front end", "lower end", "left side", "right side", and the like may be defined by the drawings, but the shape and the location of the component is not limited by the term.

The present disclosure is directed to providing a display apparatus capable of satisfying both heat dissipation and rigidity standards while reducing a thickness of a support panel.

A display apparatus may satisfy both heat dissipation and rigidity standards while reducing a thickness of a support panel.

Hereinafter, exemplary embodiments of the present disclosure will be described in detail with reference to the accompanying drawings.

Figure 2:
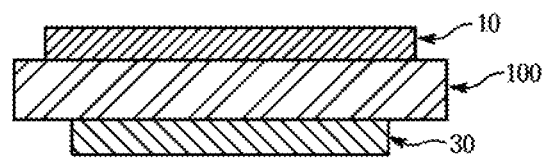
FIG. 2 is a schematic cross-sectional view of the display apparatus according to one embodiment of the present disclosure.

FIG. 1 is a schematic exploded perspective view of a display apparatus according to one embodiment of the present disclosure, and FIG. 2 is a schematic cross-sectional view of the display apparatus according to one embodiment of the present disclosure.

As illustrated in FIGS. 1 and 2, a display apparatus may include a display panel 10 on which a screen is displayed, a front cover 20 arranged in front of the display panel 10, a support panel 100 arranged at a rear of the display panel 10, and a control module 30 arranged at a rear of the support panel 100.

A definition of the front cover 20 and the support panel 100 is based on when the display apparatus stands upright to allow the display panel 10 to face forward. Alternatively, when the display apparatus is laid down to allow the display panel 10 to face upward, the front cover 20 may serve as a top cover and the support panel 100 may serve as a bottom chassis.

The display panel 10 may be a panel configured to emit light by itself without a backlight unit, such as an organic light emitting diode (OLED).

The front cover 20 may be arranged in front of the display panel 10 to form a front edge appearance of the display apparatus.

The support panel 100 may be arranged at the rear of the display panel 10 to form a rear exterior of the display apparatus. The support panel 100 may include a first body 110 arranged at the rear of the display panel 10, a second body 120 bonded to the first body 110 at the rear of the first body 110, and a heat absorbing material 130 filled in a space between the first body 110 and the second body 120 (refer to FIG. 3). The support panel 100 may form the rear exterior of the display apparatus by itself. Alternatively, a separate rear case 140 may be arranged at the rear of the support panel 100 to form a rear exterior of the display apparatus.

The control module 30 may be arranged at the rear of the support panel 100 to control the display panel 10. When the separate rear case 140 is arranged at the rear of the support panel 100, the control module 30 may be arranged between the support panel 100 and the rear case 140.

Figure 3:
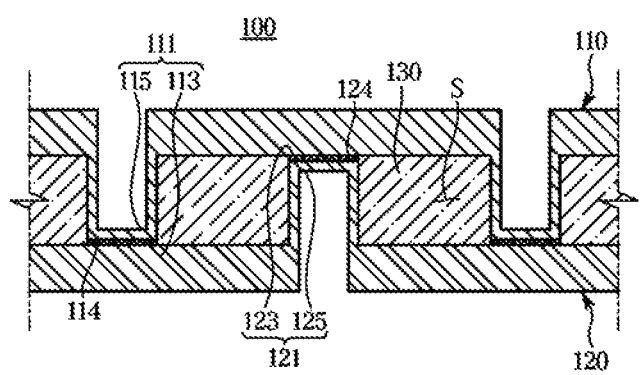
FIG. 3 is a schematic cross-sectional view of a support panel according to one embodiment of the present disclosure.

FIG. 3 is a schematic cross-sectional view of a support panel according to one embodiment of the present disclosure.

As illustrated in FIG. 3, the support panel 100 may include the first body 110 arranged at the rear of the display panel 10, the second body 120 bonded to the first body 110 at the rear of the first body 110 to form an accommodation space S with the first body 110, and the heat absorbing material 130 filled in accommodation space S (refer to FIG. 1).

The first body 110 may be a metal having a high thermal conductivity and high rigidity, such as steel or aluminum. The first body 110 may be arranged at the rear of the display panel 10 to absorb heat generated from the display panel 10. Heat generated by the display panel 10 may be dissipated through the support panel 100. Heat generated from the display panel 10 may be dissipated through the support panel 100 to prevent an increase in a temperature of the display panel 10 (refer to FIG. 1).

The second body 120 may be a metal having a high thermal conductivity and high rigidity, such as steel or aluminum. The second body 120 may be bonded to the first body 110 at the rear of the first body 110 to form the accommodation space S with the first body 110. When the heat generated from the display panel 10 is absorbed by the first body 110, the heat absorbed by the first body 110 may be transferred to the second body 120 through the heat absorbing material 130. The heat transferred to the second body 120 may be radiated to the outside. Accordingly, the heat generated from the display panel 10 may be dissipated to the outside through the support panel 100 to prevent the increase in the temperature of the display panel 10 (refer to FIG. 1).

The heat absorbing material 130 may be filled in the accommodation space S formed between the first body 110 and the second body 120. The heat absorbing material 130 may be a material having high specific heat and high latent heat. Because the heat absorbing material 130 has high specific heat and high latent heat, the heat absorbing material 130 may efficiently receive heat absorbed by the first body 110. Accordingly, the heat generated in the display panel 10 and absorbed by the first body 110 may be rapidly transferred to the heat absorbing material 130 to prevent the increase in the temperature of the display panel 10 (refer to FIG. 1).

The support panel 100 may form a three-layer structure including the first body 110, the heat absorbing material 130, and the second body 120. Because the support panel 100 has the three-layer structure, it is possible to efficiently prevent deformation of the support panel 100 caused by thermal expansion.

The first body 110 and the second body 120 may include a plurality of beading 111 and 121 each protruding in a direction facing each other. The plurality of beading 111 and 121 may include a plurality of first beading 111 protruding from the first body 110 toward the second body 120 and a plurality of second beading 121 protruding from the second body 120 toward the first body 110.

Each of the plurality of first beading 111 may include a first protruding portion 113 protruding toward the second body 120 and a first concave portion 115 formed on an opposite surface of the first protruding portion 113. The first protruding portion 113 protruding toward the second body 120 may be bonded to the second body 120. A first bonding surface 114 may be formed at a portion in which the first protruding portion 113 is bonded to the second body 120. The first concave portion 115 may be provided in a shape in which a groove is recessed on the opposite surface of the first protruding portion 113. The first concave portion 115 may be an empty space that is not filled with anything.

Each of the plurality of second beading 121 may include a second protruding portion 123 protruding toward the first body 110 and a second concave portion 125 formed on an opposite surface of the second protruding portion 123. The second protruding portion 123 protruding toward the first body 110 may be bonded to the first body 110. A second bonding surface 124 may be formed at a portion in which the second protruding portion 123 is bonded to the first body 110. The second concave portion 125 may be provided in a shape in which a groove is recessed on the opposite surface of the second protruding portion 123. The second concave portion 125 may be an empty space that is not filled with anything.

The support panel 100 may include a double junction structure in which the first protruding portion 113 formed on the first body 110 is bonded to the second body 120, and the second protruding portion 123 formed on the second body 120 is bonded to the first body 110. Because the support panel 100 includes the double junction structure, it is possible to efficiently prevent deformation of the support panel 100 caused by thermal expansion.

A contact area between the heat absorbing material 130, which is filled in the accommodation space S, and the first body 110 may be increased by the plurality of first beading 111 formed on the first body 110. When the contact area between the first body 110 and the heat absorbing material 130 is increased, the heat absorbed by the first body 110 may be more efficiently transferred to the heat absorbing material 130. As a result, the heat generated by the display panel 10 may be more efficiently dissipated (refer to FIG. 1).

A contact area between the heat absorbing material 130, which is filled in the accommodation space S, and the second body 120 may be increased by the plurality of second beading 121 formed on the second body 120. When the contact area between the second body 120 and the heat absorbing material 130 is increased, the heat that is absorbed by the first body 110 and transferred to the heat absorbing material 130 may be more efficiently transferred to the second body 120. As a result, the heat generated by the display panel 10 may be more efficiently dissipated (refer to FIG. 1).

By forming the first body 110 and the second body 120 with members having different thermal conductivities, it is possible to control a direction, in which the heat generated by the display panel 10 is transferred. For example, the first body 110 that absorbs heat generated by the display panel 10 may be formed of a metal having a high thermal conductivity. The second body 120 that radiates the heat absorbed by the first body 110 to the outside may be formed of a metal having a low thermal conductivity. When the first body 110 has a high thermal conductivity and the second body 120 has a low thermal conductivity, the transfer of the heat absorbed by the first body 110 may be reduced in a thickness direction, which is a vertical direction in the drawing. In response to the heat transfer in the thickness direction being reduced, heat may be better transferred in a horizontal direction in the drawing. In this case, the heat absorbing material 130 may be selected as a material having a high or low thermal conductivity according to the direction in which the heat generated by the display panel 10 is transferred (refer to FIG. 1).

The plurality of first protruding portions 113 and the second body 120, and the plurality of second protruding portions 123 and the first body 110 may be bonded to each other by an adhesive.

Alternatively, the plurality of first protruding portions 113 and the second body 120, and the plurality of second protruding portions 123 and the first body 110 may be bonded by mechanical bonding by press-fitting or brazing, respectively.

Figure 4:
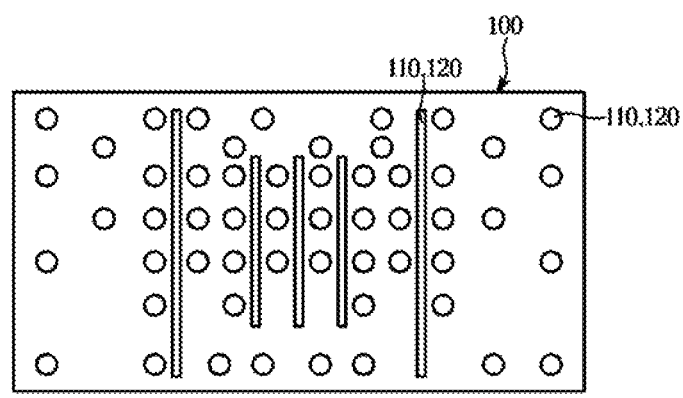
FIG. 4 is a view schematically illustrating a state in which a plurality of beading is formed on the support panel according to one embodiment of the present disclosure.

FIG. 4 is a view schematically illustrating a state in which a plurality of beading is formed on the support panel according to one embodiment of the present disclosure.

The support panel 100, on which the plurality of beading 111 and 121 illustrated in FIG. 4 is formed, may be one of the first body 110 and the second body 120.

As illustrated in FIG. 4, the plurality of beading 111 and 121 may be formed in a circular shape or a straight shape having a length. The heat generated from the display panel 10 may have a relatively higher temperature at the center and upper end of the display panel 10 than at the edge of the display panel 10. Accordingly, the plurality of beading 111 and 121 may be formed to have a high density in the support panel 100 at positions corresponding to the center and upper ends of the display panel 10 where heat of a relatively high temperature is generated. In the drawings, it is illustrated that a portion of the plurality of beading 111 and 121 is formed in the circular shape and another portion of the plurality of beading 111 and 121 is formed in the straight shape having a length, but is not limited thereto. Alternatively, all of the plurality of beading 111 and 121 may be formed in the circular shape or all of the plurality of beading 111 and 121 may be formed in the straight shape. Further, as for an edge-type display in which a light emitting diode is applied to one side of the rear surface of the display panel according to another embodiment, the plurality of beading 111 and 121 may be formed at a high density around the edge where heat of a high temperature is generated.

Figure 5:
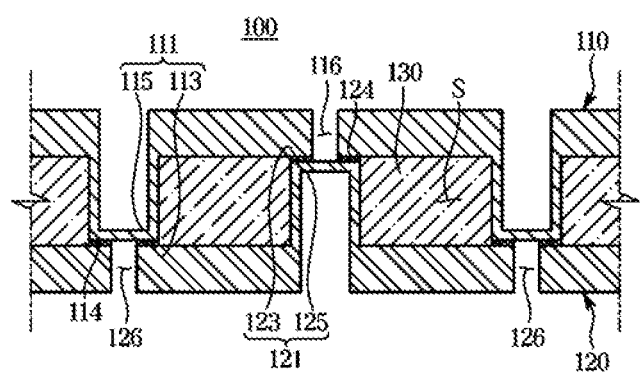
FIG. 5 is a cross-sectional view schematically illustrating a state in which a hole is formed on a first body and a second body of a support panel according to another embodiment of the present disclosure.

FIG. 5 is a cross-sectional view schematically illustrating a state in which a hole is formed on a first body and a second body of a support panel according to another embodiment of the present disclosure.

As illustrated in FIG. 5, a hole 126 may be formed in a second body 120 corresponding to a first bonding surface 114 in which a plurality of first protruding portions 111 is bonded to the second body 120. In addition, a hole 116 may be formed in a first body 110 corresponding to a second bonding surface 124 in which a plurality of second protruding portions 121 is bonded to the first body 110.

Figure 6:
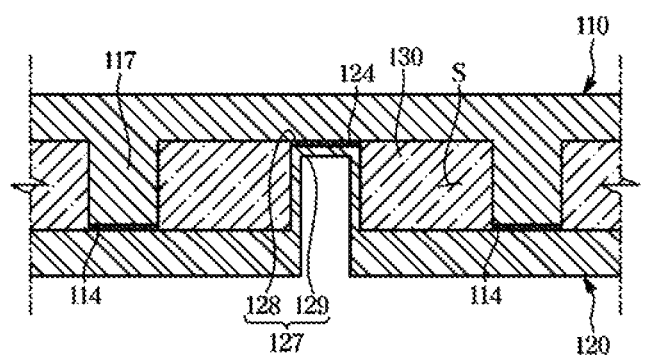
FIG. 6 is a cross-sectional view schematically illustrating a state in which a plurality of protrusions is formed on a first body of a support panel according to another embodiment of the present disclosure.
Figure 7:
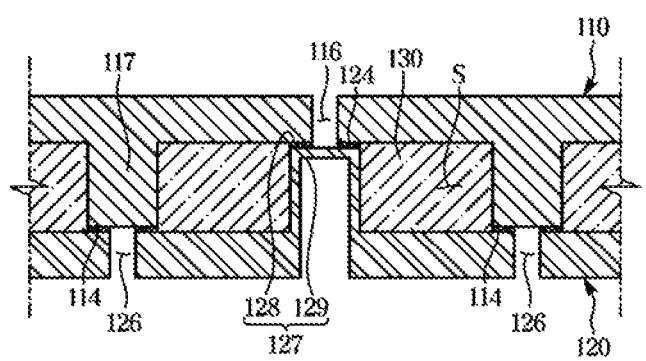
FIG. 7 is a cross-sectional view schematically illustrating a state in which a hole is formed on the first body and the second body of FIG. 6.

FIG. 6 is a cross-sectional view schematically illustrating a state in which a plurality of protrusions is formed on a first body of a support panel according to another embodiment of the present disclosure, and FIG. 7 is a cross-sectional view schematically illustrating a state in which a hole is formed on the first body and the second body of FIG. 6.

As illustrated in FIG. 6, a first body 110 may include a plurality of protrusions 117 protruding in a direction facing a second body 120 and bonded to the second body 120. The second body 120 may include a plurality of beading 127 protruding in a direction facing the first body 110 and bonded to the first body 110.

The plurality of protrusions 117 is the same as the first beading 111 of the first body 110 illustrated in FIG. 3 except that there is no concave portion on the opposite surface, and thus a detailed description thereof will be omitted.

A configuration, in which the plurality of beading 127 formed on the second body 120 includes a protruding portion 128 and a concave portion 129, is the same as the configuration of the second beading 121 of the second body 120 as illustrated in FIG. 3, and thus detailed descriptions will be omitted.

Because a configuration of a bonding surface and a hole illustrated in FIG. 7 is the same as the configuration of the bonding surface and the hole illustrated in FIG. 3, the configuration of FIG. 7 has the same reference numbers as those of FIG. 3.

As illustrated in FIG. 7, a hole 126 may be formed in a second body 120 corresponding to a first bonding surface 114 in which a plurality of protrusions 117 is bonded to the second body 120. In addition, a hole 116 may be formed in a first body 110 corresponding to a second bonding surface 124 in which a plurality of protruding portions 128 is bonded to the first body 110.

Figure 8:
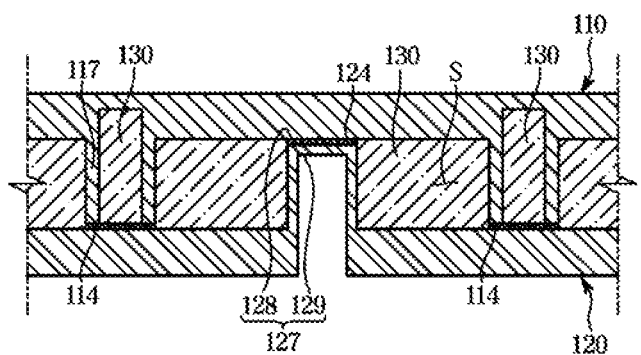
FIG. 8 is a cross-sectional view schematically illustrating a state in which a plurality of protrusions is formed on a first body of a support panel, and a state in which a heat absorbing material is filled in the plurality of protrusions according to another embodiment of the present disclosure.
Figure 9:
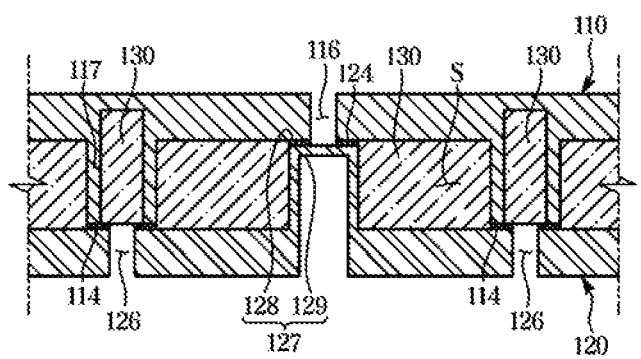
FIG. 9 is a cross-sectional view schematically illustrating a state in which a hole is formed on the first body and the second body of FIG. 8.

FIG. 8 is a cross-sectional view schematically illustrating a state in which a plurality of protrusions is formed on a first body of a support panel, and a state in which a heat absorbing material is filled in the plurality of protrusions according to another embodiment of the present disclosure, and FIG. 9 is a cross-sectional view schematically illustrating a state in which a hole is formed on the first body and the second body of FIG. 8.

As illustrated in FIG. 8, a first body 110 may include a plurality of protrusions 117 protruding in a direction facing a second body 120 and bonded to a second body 120. The second body 120 may include a plurality of beading 127 protruding in a direction facing the first body 110 and bonded to the first body 110.

Because the plurality of protrusions 117 is the same as the protrusions 117 of the first body 110 illustrated in FIG. 6 except that the heat absorbing material 130 is filled therein, a detailed description thereof will be omitted.

A configuration, in which the plurality of beading 127 formed on the second body 120 includes a protruding portion 128 and a concave portion 129, is the same as the configuration of the second body 120 illustrated in FIG. 6, and thus detail descriptions will be omitted.

Because a configuration of a bonding surface and a hole illustrated in FIG. 9 is the same as the configuration of the bonding surface and the hole illustrated in FIG. 3, the configuration of FIG. 9 has the same reference numbers as those of FIG. 3.

As illustrated in FIG. 9, a hole 126 may be formed in a second body 120 corresponding to a first bonding surface 114 in which a plurality of protrusions 117 is bonded to the second body 120. In addition, a hole 116 may be formed in a first body 110 corresponding to a second bonding surface 124 in which a plurality of protruding portions 128 is bonded to the first body 110.

Figure 10:
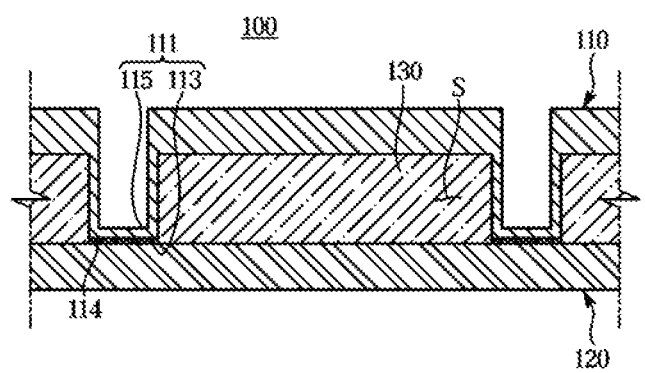
FIG. 10 is a cross-sectional view schematically illustrating a state in which a plurality of beading is formed on only a first body of a support panel according to another embodiment of the present disclosure.
Figure 11:
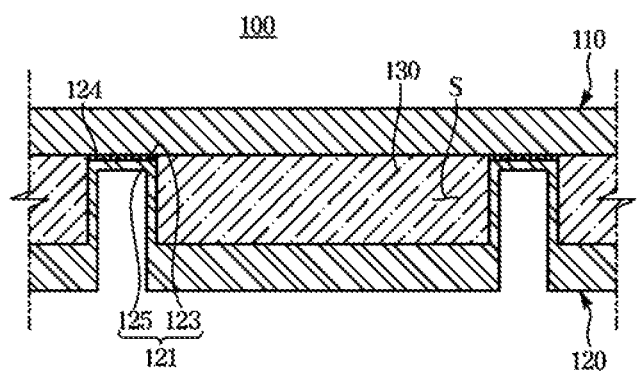
FIG. 11 is a cross-sectional view schematically illustrating a state in which a plurality of beading is formed on only a second body of a support panel according to another embodiment of the present disclosure.

FIG. 10 is a cross-sectional view schematically illustrating a state in which a plurality of beading is formed on only a first body of a support panel according to another embodiment of the present disclosure, and FIG. 11 is a cross-sectional view schematically illustrating a state in which a plurality of beading is formed on only a second body of a support panel according to another embodiment of the present disclosure.

As illustrated in FIG. 10, a first body 110 may include a plurality of first beading 111 protruding in a direction toward a second body 120 and bonded to the second body 120. Because a configuration of the first body 110 is the same as that of the first body 110 illustrated in FIG. 3, a detailed description thereof will be omitted.

In comparison with the second body 120 illustrated in FIG. 3, a configuration of a plurality of second beading 121 may be omitted in the second body 120.

As illustrated in FIG. 11, a second body 120 may include a plurality of second beading 121 protruding in a direction toward a first body 110 and bonded to the first body 110. Because a configuration of the second body 120 is the same as that of the second body 120 illustrated in FIG. 3, a detailed description thereof will be omitted.

In comparison with the first body 110 illustrated in FIG. 3, a configuration of a plurality of first beading 111 may be omitted in the first body 110.

While the present disclosure has been particularly described with reference to exemplary embodiments, it should be understood by those of skilled in the art that various changes in form and details may be made without departing from the spirit and scope of the present disclosure.

What is claimed is:

1. A display apparatus comprising:
   a display panel;
   a support panel arranged at a rear of the display panel; and
   a control module arranged at a rear of the support panel to control the display panel, wherein the support panel comprises:
   a first body arranged at the rear of the display panel,
   a second body bonded to the first body at a rear of the first body to form an accommodation space with the first body, and
   a heat absorbing material accommodated in the accommodation space to receive heat from the display panel that is absorbed by the first body to thereby reduce an increase in a temperature of the display panel, wherein
   the first body and the second body comprise a plurality of beading formed to protrude along a direction facing each other,
   the plurality of beading comprises a plurality of first beading formed to protrude from the first body toward the second body, and a plurality of second beading to protrude from the second body toward the first body, and
   each beading of the plurality of first beading comprises a first protruding portion formed to protrude toward the second body, and a first concave portion formed on an opposite surface of the first protruding portion.

2. The display apparatus of claim 1, wherein each of the plurality of second beading comprises a second protruding portion formed to protrude toward the first body, and a second concave portion formed on an opposite surface of the second protruding portion.

3. The display apparatus of claim 2, wherein the first protruding portion is among a plurality of first protruding portions and the second protruding portion is among a plurality of second protruding portions, and
the support panel comprises a three-layer structure, and a double junction structure where the plurality of first protruding portions are bonded to the second body and the plurality of second protruding portions are bonded to the first body.

4. The display apparatus of claim 3, wherein a contact area between the first body and the heat absorbing material is increased by the plurality of first beading, and a contact area between the second body and the heat absorbing material is increased by the plurality of second beading.

5. The display apparatus of claim 4, wherein heat generated by the display panel is absorbed by the first body and the heat absorbed by the first body is transferred to the heat absorbing material through a contact surface that is increased between the first body and the heat absorbing material.

6. The display apparatus of claim 5, wherein heat transferred to the heat absorbing material is transferred to the second body through a contact surface that is increased between the second body and the heat absorbing material, and the heat discharged to an outside.

7. The display apparatus of claim 6, wherein the plurality of first beading and the plurality of second beading is formed to have a high density, respectively, at a position corresponding to a center and an upper end of the display panel at which the temperature of the display panel is relatively high.

8. The display apparatus of claim 3, wherein the plurality of first protruding portions and the plurality of second protruding portions are bonded to the second body and the first body, respectively, by an adhesive.

9. The display apparatus of claim 3, wherein the plurality of first protruding portions and the plurality of second protruding portions are bonded to the second body and the first body, respectively, by mechanical bonding by press-fitting or brazing.

10. The display apparatus of claim 3, wherein a hole is formed in the second body corresponding to a bonding surface between the plurality of first protruding portions and the second body, and a hole is formed in the first body corresponding to a bonding surface between the plurality of second protruding portions and the first body.

11. A display apparatus comprising:
    a display panel;
    a support panel arranged at a rear of the display panel; and
    a control module arranged at a rear of the support panel to control the display panel, wherein the support panel comprises:
    a first body arranged at the rear of the display panel,
    a second body bonded to the first body at a rear of the first body to form an accommodation space with the first body, and
    a heat absorbing material accommodated in the accommodation space to receive heat from the display panel that is absorbed by the first body to thereby reduce an increase in a temperature of the display panel, wherein
    the first body comprises a plurality of protrusions formed to protrude along a direction facing the second body and bonded to the second body, and the second body comprises a plurality of beading formed to protrude along a direction facing the first body and bonded to the first body, and
    the heat absorbing material is filled in the plurality of protrusions, and each of the plurality of beading comprises a protruding portion formed to protrude toward the first body and a concave portion formed on an opposite surface of the protruding portion.

* * * * *